United States Patent [19]

Yutani et al.

[11] Patent Number: 5,040,038

[45] Date of Patent: Aug. 13, 1991

[54] SOLID-STATE IMAGE SENSOR

[75] Inventors: Naoki Yutani; Sotoju Asai; Shiro Hine; Satoshi Hirose; Hidekazu Yamamoto; Masashi Ueno, all of Hyogo, Japan

[73] Assignee: Mitsubishi Denki Kabushiki Kaisha, Tokyo, Japan

[21] Appl. No.: 262,056

[22] Filed: Oct. 24, 1988

Related U.S. Application Data

[63] Continuation of Ser. No. 938,324, Nov. 28, 1986, abandoned.

[30] Foreign Application Priority Data

Nov. 27, 1985 [JP] Japan .................... 60-268430

[51] Int. Cl.$^5$ .................... H01L 29/78; H01L 27/14; H01L 31/00
[52] U.S. Cl. .................... 357/24; 377/60; 377/61; 377/62; 377/63; 357/30; 358/213.22; 358/213.23
[58] Field of Search ............ 357/24 LR, 24 M, 24 R, 357/30 D, 30 H, 30 Q; 377/60, 61, 62, 63; 358/213.22, 213.23

[56] References Cited

U.S. PATENT DOCUMENTS

| 4,001,861 | 1/1977 | Carnes | 357/24 LR |
|---|---|---|---|
| 4,518,978 | 5/1985 | Takeshita | 357/24 LR |
| 4,546,368 | 10/1985 | Yamanari | 357/24 |
| 4,558,341 | 12/1985 | Narabu et al. | 357/24 M |
| 4,577,233 | 3/1986 | Kimata | 358/213 |
| 4,580,155 | 4/1986 | Tsoi et al. | 357/24 M |
| 4,581,539 | 4/1986 | Kimata | 250/578 |
| 4,661,854 | 4/1987 | Savoye | 357/24 LR |
| 4,695,889 | 9/1987 | Portmann | 357/242 R |
| 4,758,895 | 7/1988 | Elabd | 358/213.22 |

OTHER PUBLICATIONS

Proceedings SPIE, vol. 930, Apr. 1988, pp. 15-17, Kimata et al, High Density Schottky-Barrier, IR Image Sensor.

"A 480 x 400 Element Image Sensor With a Charge Sweep Device", M. Kimata et al, '85 IEEE Int'l Solid State Circuits Conference, Feb. 13, 1985, pp. 100-101.

"A ½ Format Color Image Sensor with 485×510 Pixels", M. Yamawaki et al, Electronic Imaging, 1985, pp. 91-94.

Technical Report TEBS101-6ED841 of Institute of Television Engineers of Japan, by M. Kimata et al, pp. 31-36.

Primary Examiner—Andrew J. James
Assistant Examiner—Ngan Van Ngo
Attorney, Agent, or Firm—Lowe, Price, LeBlanc and Becker

[57]  ABSTRACT

A solid-state image sensor comprises photoelectric converting devices (22) formed on a p type semiconductor substrate (1), transfer gates (26) for reading signal charges therefrom, scanning lines (21) for selecting the transfer gates (26), and transfer electrodes (11) of the first layer and transfer electrodes (12) of the second layer alternately disposed for transferring in the vertical direction the read signal charges. All the electrodes of the transfer gates (26) are formed integrally with the transfer electrodes (12) of the second layer, with the result that all the electrodes of the transfer gates (26) are common to the transfer electrodes of the same layer (the second layer). Although the potential wall (340) is formed in the transfer channel (3) beneath the transfer electrode (12) connected to the transfer gate (26), the same is insulated from adjacent the transfer electrode (11) on the charge transfer direction side. As a result, when a voltage is applied to the transfer electrode adjacent thereto, the signal charges are fully transferred.

21 Claims, 6 Drawing Sheets

SOLID-STATE IMAGE SENSOR

This application is a continuation of application Ser. No. 938,324 filed on Nov. 28, 1986, now abandoned.

BACKGROUND OF THE INVENTION

1. Field of the Invention

The present invention relates to a solid-state image sensor and, more particularly, to an improvement in a high sensitivity solid-state image sensor of such as a CSD (Charge Sweep Device) type.

2. Description of the Prior Art

Recently, the degree of large scale integration of solid-state image sensors has considerably increased and the area occupied by each picture element has become very minute. With such an increased degree of large scale integration, it has come to be required that solid-state image sensors are of increased sensitivity. In order to meet such requirement, solid-state image sensors of a CSD type were developed. The fundamental operation of such CSD type solid-state image sensors is described in the paper entitled "A 480×400 Element Image Sensor with a Charge Sweep Device" by M. Kimata et al. appearing in pages 100 and 101 of ISSCC, DIGEST OF TECHNICAL PAPERS, February, 1985. Furthermore, a color image sensor employing the CSD type is described in the article entitled "A ½" Form at Color Image Sensor with 485×510 Pixels" by M. Yamawaki et al. appearing in pages 91 through 94 of Technical Digest of Electronic Imaging '85. In summary, the above described CSD type solid-state image sensor is structured such that signal electric charges read from photoelectric converting devices corresponding to one horizontal line are swept to the vicinity of the horizontal transfer device (horizontal CCD) through the vertical transfer devices (vertical CCD) during one horizontal period and the same are further transferred to the horizontal CCD during the horizontal blanking period, so that the same are read out in succession during the next horizontal period. According to such a system, even if channel width of the charge transfer means in the vertical direction (vertical CCD) is made very narrow, an increased amount of signal charges can be transferred and, accordingly, a conversion area/pixel area ratio, i.e. the ratio of the area occupied by the photoelectric converting device to the area of each pixel can be increased.

Figure 1:
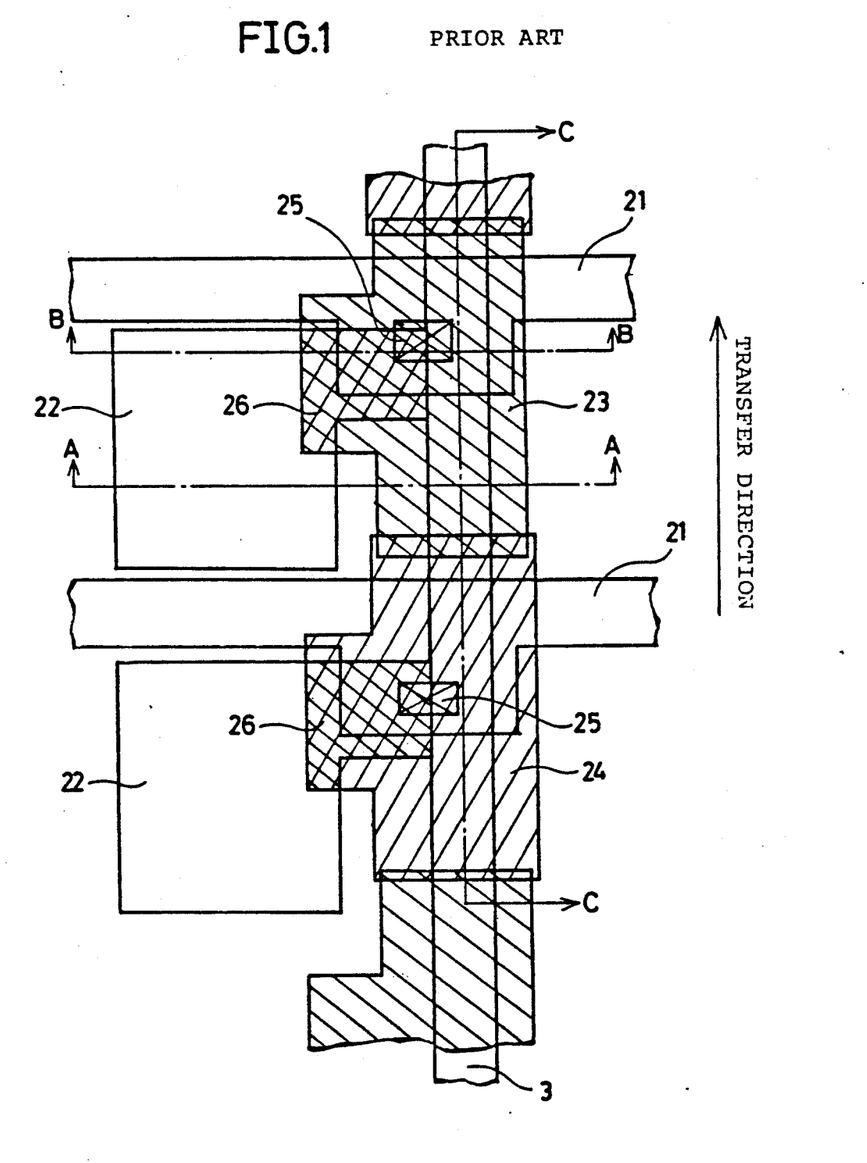
FIG. 1 is a plan view of a conventional CSD type solid-state image sensor.
Figure 2A:
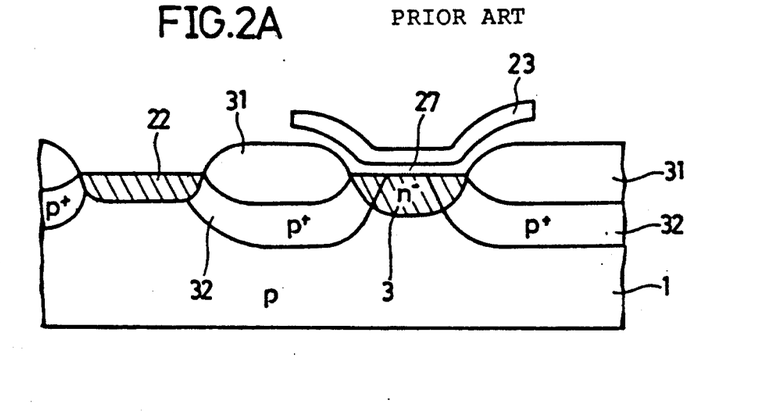
FIG. 2A is a sectional view taken along the line A—A in FIG. 1.
Figure 2B:
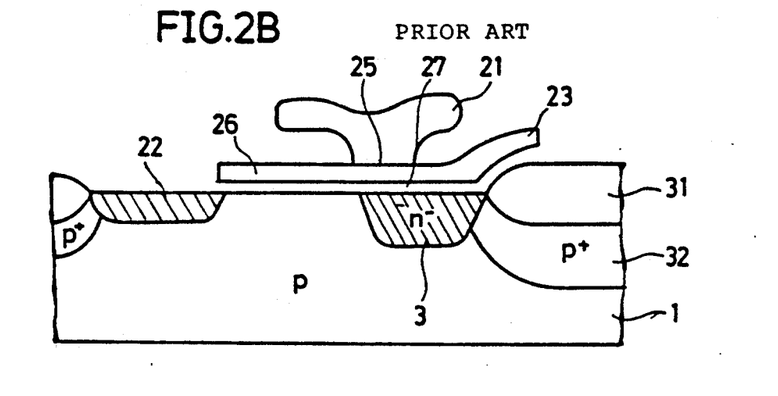
FIG. 2B is a sectional view taken along the line B—B in FIG. 1.

FIG. 1 is a plan view showing a solid-state image sensor of such a conventional CSD type. FIG. 2A is a sectional view taken along the line A—A in FIG. 1 and FIG. 2B is a sectional view taken along the line B—B in FIG. 1.

First, the structure of the conventional CSD type solid-state image sensor shown in FIGS. 1 to 2B will be described.

Referring to FIG. 1, one pixel of the solid-state image sensor comprises a photoelectric converting device 22 formed of a p-n junction for converting incident light into signal electric charges, a transfer gate 26 for selectively reading the signal charges from the photoelectric converting device 22, and a transfer electrode 23 or 24 for transferring the read signal charges in the vertical direction through the transfer gate 26. The electrode for the transfer gate 26 and the transfer electrode 23 or 24 for transferring the signal charges in the vertical direction are commonly implemented. A scanning line 21 constituting a signal path for selecting the photoelectric converting devices 22 constituting one row in the horizontal direction is coupled to the transfer electrode 23 or 24 through a contact hole 25.

Further referring to FIG. 2A, the structure in section taken along the line A—A in FIG. 1 is seen, wherein a transfer channel 3 of a buried type serving as an electric charge transfer path in the vertical direction is formed on a p type semiconductor substrate 1, the transfer channel 3 comprising an $n^-$ type impurity diffused layer. A gate insulating film 27 is formed on the transfer channel 3 and the transfer electrode 23 for controlling the vertical transfer operation is formed further thereon. On the other hand, the photoelectric converting device 22 is formed on the p type semiconductor substrate 1 and a thick oxide film 31 and a $p^+$ type impurity diffused layer 32 are formed for electrical separation between the adjacent devices.

Referring to FIG. 2B, the structure in section taken along the line B—B in FIG. 1 is seen, wherein a transfer gate 26 is formed between the photoelectric converting device 22 and the transfer channel 3 and accordingly the $p^+$ type impurity diffused layer 32 for separation of the devices is not formed therein as shown in FIG. 2A. A scanning line 21 for selecting the photoelectric converting device 22 is coupled to the transfer electrode 23 through the contact hole 25.

Now, description will be made of an outline of the operation of the conventional CSD type solid-state image sensor shown in FIGS. 1 to 2B. The operation of such solid-state image sensor is fully described in the above described publications and in an article by M. Kimata el al. appearing on page 31 of the technical report TEBS101-6ED841 of the Institute of Television Engineers of Japan.

First, photoelectric converting devices 22 in one row are selected by a single scanning line 21. The signal charges from the selected photoelectric converting device 22 are read out on the vertical directional transfer channel 3 through the transfer gate 26 and are transferred in the vertical direction. The transfer of the signal charges in the vertical direction is done during one horizontal period and the same are read out in the horizontal CCD during the horizontal blanking period. The CSD type solid-state image sensor structure described above has a great advantage that the width of the transfer channel portion can be made thin. More specifically, since the same is structured such that only the signal charges from a single photoelectric converting device are read out over the single vertical transfer device, an ample amount of transfer charges can be obtained even when the channel width is selected to be narrow. In other words, since the length of the potential well in the vertical charge transfer device (CSD) comes to be equivalent to the length of one vertical line, the area of the potential well becomes sufficiently large even in case of a narrowed channel width, whereby an ample amount of transfer charges can be provided.

Figure 3:
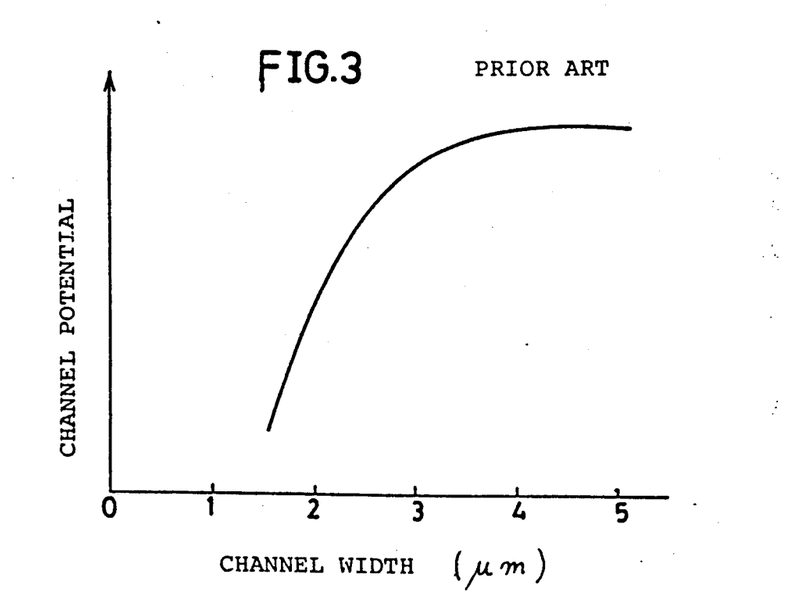
FIG. 3 is a graph showing a relation between the width of the buried type transfer channel and the channel potential formed therein in case where the same gate voltage is applied.

Meanwhile, FIG. 3 is an graph showing a relation between he width of the buried type transfer channel and the channel potential formed therein in case where the same gate voltage is applied. As shown in FIG. 3, as the width of the transfer channel is decreased, the channel potential formed therein is accordingly decreased. The reason is considered to be that due to diffusion in the lateral direction of impurities from the $p^+$ type impurity diffused layer 32 for channel cutting, the impurity concentration of the buried transfer channel 3 is compensated. Such a phenomenon becomes particularly noticeable in case where the width of the transfer channel 3 is decreased. As shown in FIG. 2B, the transfer channel 3 of the n⁻ type impurity diffused layer connected to the transfer gate 26 is influenced by the p+ type impurity diffused layer 32 only from one side, whereas as shown in FIG. 2A, the other portion comes to be influenced by the p+ type impurity diffused layers 32 from both sides.

Figure 4A:
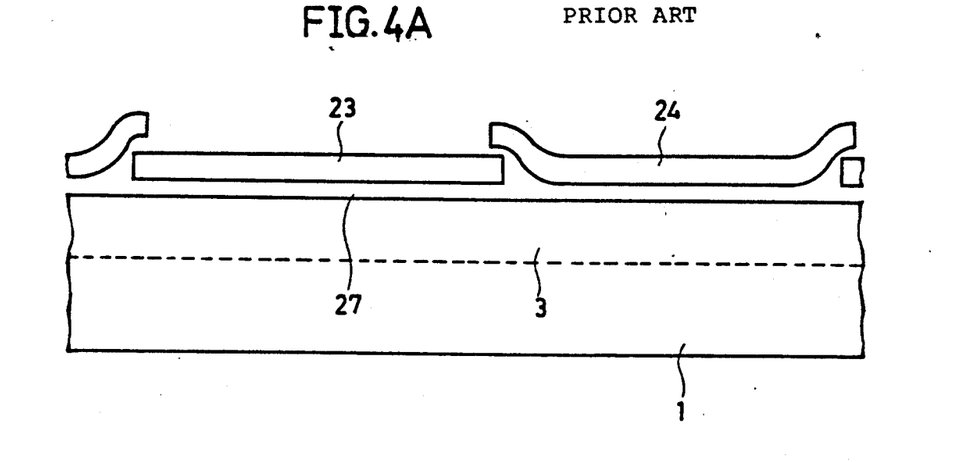
FIG. 4A is a sectional view taken along the line C—C in FIG. 1.
Figure 4B:
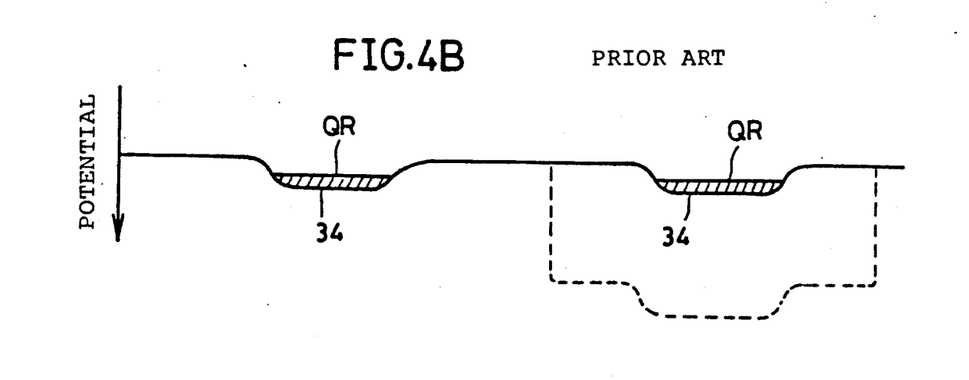
FIG. 4B is a view showing the state of the potential at various portions in FIG. 4A.

FIG. 4A is a sectional view taken along the line C—C in FIG. 1 and FIG. 4B is a view showing the state of a potential well formed therein. As shown in FIG. 2B, since the portion connected to the transfer gate 26 within the transfer electrodes 23 and 24, i.e. an approximate central portion of each transfer electrode, is only influenced by p+ type impurity diffused layer 32 from one side, a deep potential well 34 is formed in that portion as shown in FIG. 4B. Therefore, the charges trapped by the deep potential wells 34 in such center of the transfer electrode cannot contribute to transfer, resulting in a problem that the charges $Q_R$ left without being read arise to degrade the transfer efficiency.

Furthermore, in the conventional solid-state image sensor of FIG. 1, the transfer electrode 23 is formed with a first layer of polysilicon, for example, and the transfer electrode 24 is formed with a second layer of polysilicon, the electrode of the transfer gate 26 is implemented commonly to the transfer electrode 23 or 24, as described previously. This means that the electrodes of the transfer gates 26 to be common to the transfer electrodes 23 of the first layer and the same to be common to the transfer electrodes 24 of the second layer are formed to be disposed alternately. Accordingly, if and when there are increased disregistration of the mask, difference in working dimension, difference in thickness of the gate insulating film 27 between the transfer electrode 23 of the first layer and the transfer electrode 24 of the second layer, then a difference occurs in the transistor characteristic between the transfer gate 26 to be common to the transfer electrode 23 and the transfer gate 26 to be common to the transfer electrode 24. Due to such a difference in the transistor characteristics, a difference occurs in the signal charges of the photoelectric converting device 22, resulting in a problem that a so-called fixed pattern noise occurs in which a difference in output is seen alternately for each horizontal line even if a uniform image is being sensed.

SUMMARY OF THE INVENTION

In summary, the present invention comprises a solid-state image sensor including a semiconductor substrate of a first conductivity type, a plurality of photoelectric converting devices formed on the semiconductor substrate, a plurality of transfer gates formed on the semiconductor substrate to correspond to the photoelectric converting devices, respectively, each having an electrode for selectively reading signal charges from the corresponding photoelectric converting device, a plurality of transfer devices formed on the semiconductor substrate for transferring in a prescribed direction the signal charges received from the transfer gates, and separating regions including high concentration impurity layers of the first conductivity type for separating the photoelectric converting devices and the transfer devices, wherein each of the transfer devices including a transfer channel of second conductivity type formed on semiconductor substrate and serving as a transfer path of signal charges received from the transfer gates, an insulating film formed on the transfer channel, and transfer electrodes of the first and the second layers formed to be disposed alternately on the insulating film for controlling transfer of the signal charges in the transfer channel, either of the transfer electrodes of the first layer and the transfer electrodes of the second layer being formed integrally with the corresponding ones of the plurality of transfer gates, respectively, so that all the electrodes in the transfer gates will be common to the transfer electrodes of the same layer, the transfer electrode being common to the electrode of the transfer gate out of the transfer electrode of the first layer and the transfer electrode of the second layer being insulated from the contiguous transfer electrode on the transfer direction side of signal charges and being electrically connected to the contiguous transfer electrode on the opposite side.

According to the other aspect of the present invention, means is provided for enhancing a potential in the transfer channel beneath the transfer electrode to be common to the electrode of the transfer gate out of the transfer electrode of the first layer and the transfer electrode of the second layer.

Accordingly, a principal object of the present invention is to provide a solid-state image sensor with an improved charge transfer efficiency in the vertical direction.

Another object of the present invention is to provide a solid-state image sensor adapted for reduction of a fixed pattern noise.

A principal advantage of the present invention is that a potential well formed in the transfer channel beneath the transfer electrode to be common to the electrode of the transfer gate can be adapted to be deeper along the transfer direction of the signal charges, whereby loss of charge transfer can be decreased.

Another advantage of the present invention is that since the electrodes of all the transfer gates are formed with transfer electrodes of the same layer, characteristics of the respective transfer gates become uniform and a fixed pattern noise for each horizontal line is eliminated.

A further advantage of the present invention is that the loss of charge transfer can be decreased by introduction of an impurity layer into a transfer channel and by a change in the film thickness of the gate insulating film.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
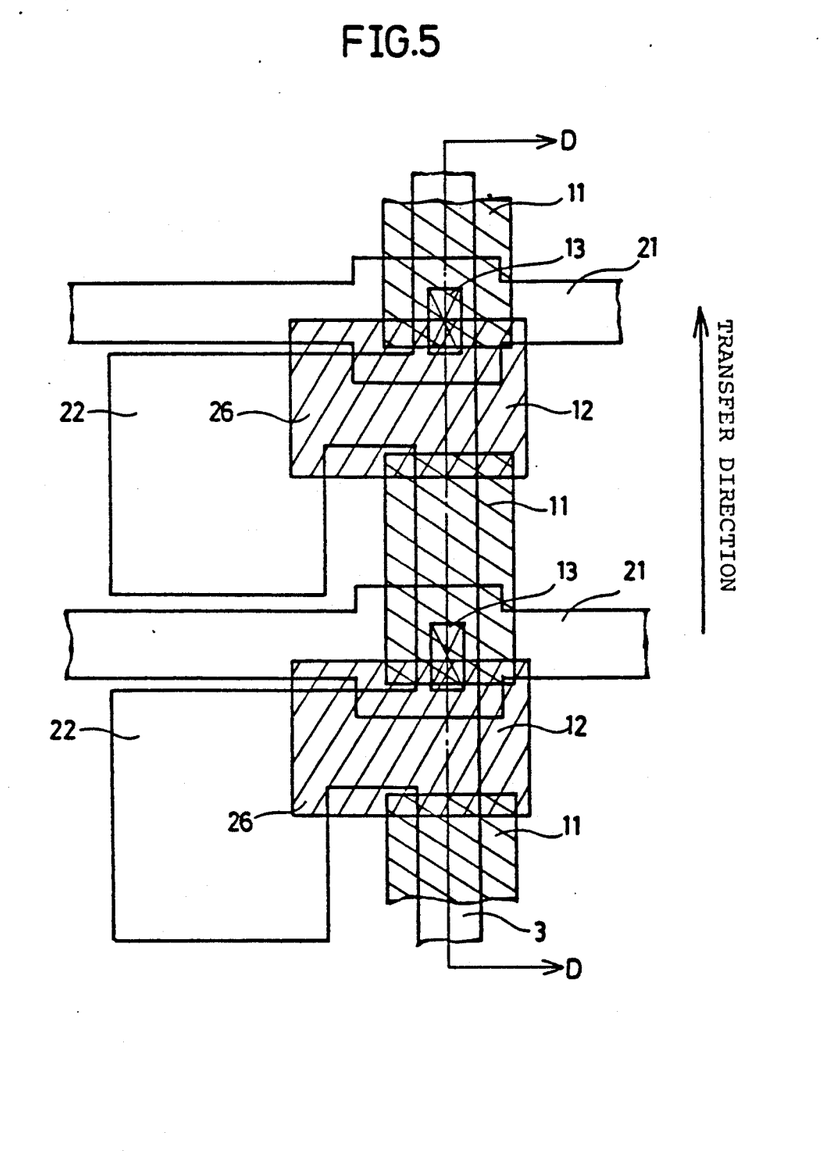
FIG. 5 is a plan view showing one embodiment of the present invention.
Figure 6A:
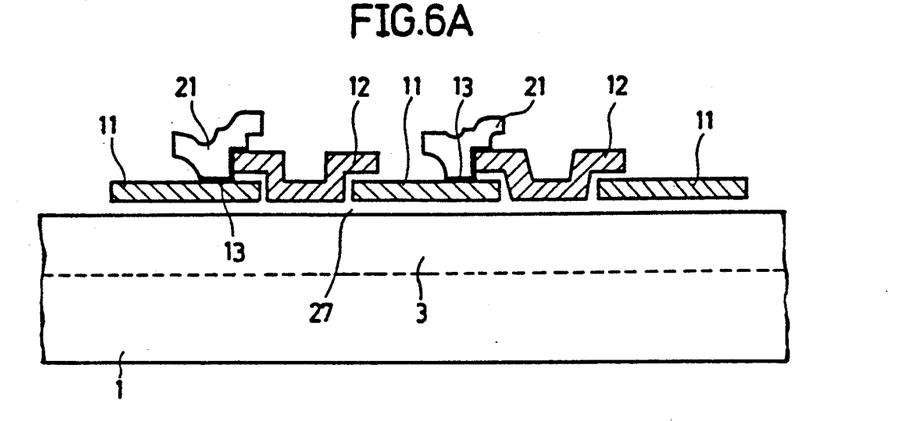
FIG. 6A is a sectional view taken along the line D—D in FIG. 5.

FIG. 5 is a plan view showing a solid-state image sensor in accordance with an embodiment of the present invention and FIG. 6A is a sectional view taken along the line D—D in FIG. 5.

The embodiment shown in FIG. 5 is substantially the same as the conventional solid-state image sensor shown in FIG. 1, except for the following respects. More specifically, referring to FIG. 5, the transfer electrodes 11 of the first layer and the transfer electrodes 12 of the second layer are disposed alternately to serve as transfer device for transferring in the vertical direction the signal charges read from the photoelectric converting devices 22 through the transfer gates 26 and all the electrodes of the transfer gates 26 are formed integrally with the transfer electrodes 12 of the second layer. Specifically described, it follows that all the electrodes of the transfer gates 26 come to be common to the transfer electrodes of the same layer (the second layer). Meanwhile, both the transfer electrodes 11 of the first layer and the transfer electrodes 12 of the second layer are formed with polysilicon. The scanning line 21 serving as a path of the signal for selecting the photoelectric converting devices 22 constituting one row in the horizontal direction is coupled to the transfer electrodes 11 and 12 through the common contact hole 13 for the transfer electrode 11 of the first layer and the transfer electrode 12 of the second layer. The transfer electrode 11 of the first layer is electrically connected through the common contact hole to the contiguous transfer electrode 12 of the second layer on the side of the transfer direction of the signal charges and is insulated from the contiguous transfer electrode 12 of the second layer on the opposite side.

Therefore, in the embodiment shown in FIGS. 5 and 6A, the electrodes of the transfer gates 26 are formed with the transfer electrodes 12 of the same layer (the second layer), so that the transistor characteristics of the transfer gates 26 become uniform, whereby the fixed pattern noise for each horizontal line observed in the conventional solid-state image sensor is reduced.

Figure 6B:
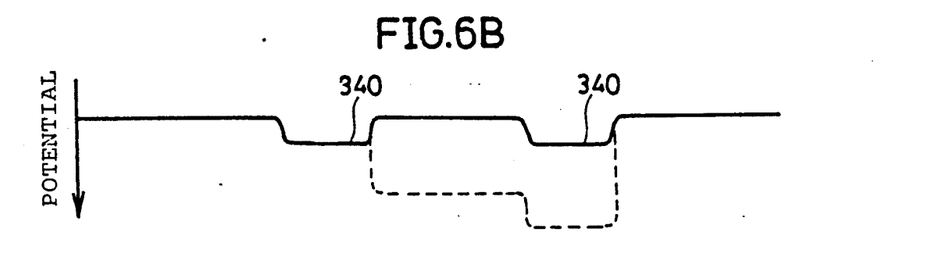
FIG. 6B is a view showing the state of the potential at various portions in FIG. 6A.

FIG. 6B is a view showing the state of potential at various portions in the sectional structure shown in FIG. 6A. As is clear from FIGS. 6A and 6B, the potential well 340 is formed in the transfer channel beneath the portion being connected to the transfer gate 26 within the transfer electrodes, as in the case of the conventional example shown in FIG. 1. However, in the embodiment shown, the potential well is formed beneath the transfer electrode 12 of the second layer and is insulated from the adjacent transfer electrode 11 of the first layer on the transfer direction side of the signal charges and, therefore, when a voltage is applied to the next adjacent transfer electrode 11 and the further next transfer electrode 12 connected thereto, the potential of the transfer channel 3 becomes as shown by the dotted line portion in FIG. 6B, with the result that the signal charges are fully transferred. More specifically, in the embodiment shown in FIGS. 5 and 6A, the potential well 340 does not adversely affect the charge transfer efficiency.

Figure 7:
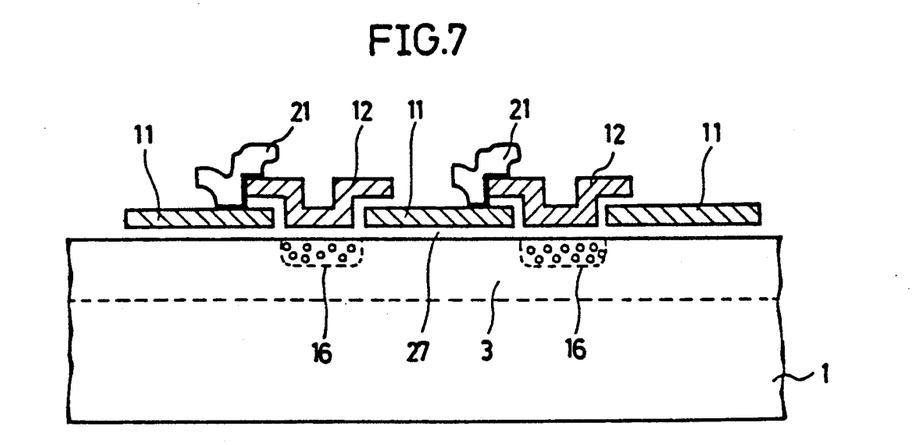
FIG. 7 is a sectional view showing another embodiment of the present invention.

FIG. 7 is a sectional view showing another embodiment of the present invention, taken along the charge transfer direction as in case of FIG. 6A. When the width of the transfer channel 3 is further decreased or the voltage applied to the transfer electrodes 11 and 12 is decreased, it is considered that the potential well 340 becomes deeper than the potential difference caused in the transfer channel 3 by application of a voltage to the transfer electrodes 11 and 12, so that the charges are trapped in the potential well 340 as in case of the conventional example, resulting in a situation of a degraded transfer efficiency of charges. In such a case, it is enough to form the p+ type impurity layer 16 in a portion beneath the transfer electrode 12 within the n− type buried transfer channel 3, as shown in FIG. 7. The p+ type impurity 16 can be formed in the transfer channel 3 beneath the transfer electrode 12 of the second layer by using an ion implantation process, for example, and through a self alignment process with the transfer electrode 11 of the first layer as a mask. Since the p+ type impurity 16 serves to enhance the potential of the transfer channel 3, the potential well 340 can be made shallow and further can be eliminated.

Figure 8:
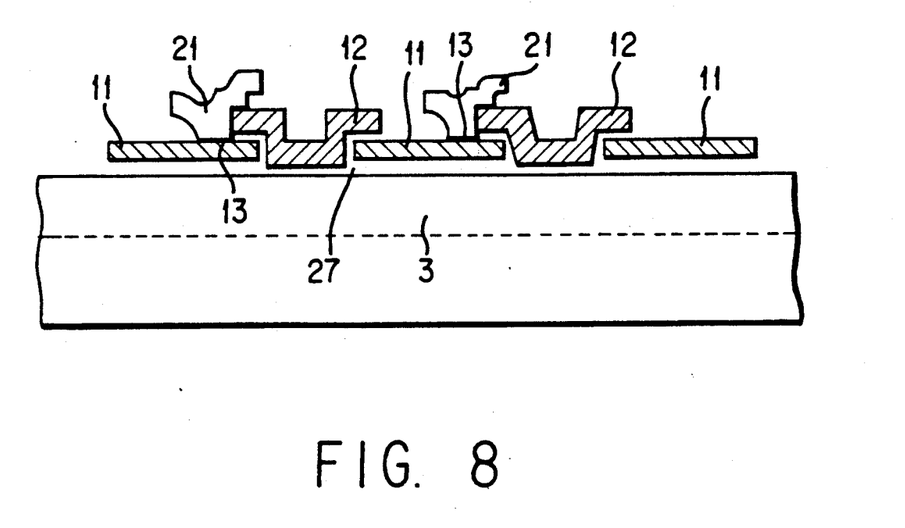
FIG. 8 is a sectional view of yet another embodiment of the present invention.

Since the potential of the transfer channel 3 can be increased by decreasing thickness of the gate insulating film 27 beneath the transfer electrodes 11 and 12, the potential well 340 can be made shallow and further can be eliminated by making thinner the thickness of the gate insulating film 27 beneath the transfer electrode 12 than the thickness of the gate insulating film 27 beneath the transfer electrode 11. Such a structure is shown in FIG. 8, wherein the thickness of insulating film 27 is thinner beneath transfer electrode 12 than beneath transfer electrode 11.

The depth of the potential well at the junction with the transfer gate 26 within the transfer channel 3 can be controlled by introducing an impurity layer in the transfer channel 3 and by changing the thickness of the gate insulating film between the transfer electrodes of the first and second layers, so that loss in the charge transfer can be decreased, with the result that the transfer efficiency can be improved.

Although the transfer electrode 12 to be common to the electrode of the transfer gate 26 was formed with polysilicon of the second layer in the above described embodiment, the same may be formed with polysilicon of the first layer. In such case, the potential well 340 can be made shallow or can be eliminated by forming the n type impurity layer (not shown) in the portion beneath the transfer electrode 11 within the n− type buried transfer channel 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a solid-state CSD image sensor having a plurality of vertical charge transfer devices each operable for vertical transfer of charge packets received from a plurality of photoelectric converting devices, and a charge coupled device receiving said charge packets from said plurality of vertical charge transfer devices for horizontal charge transfer of charge packets received from said plurality of vertical charge transfer devices, including
  a semiconductor substrate of a first conductivity type,
  a plurality of photoelectric converting devices formed on said semiconductor substrate,
  a plurality of transfer gates formed on said semiconductor substrate corresponding to said respective photoelectric converting devices and including electrodes for selectively receiving charge packets from said corresponding photoelectric converting devices, and
  a plurality of scanning lines for selecting among rows of said photoelectric converting devices to provide said charge packets to said vertical charge transfer devices, the improvement wherein:
  each said vertical transfer device includes:
    a vertical transfer channel of a second conductivity type formed on said semiconductor substrate and serving as a vertical transfer path of said charge packets received from said transfer gates,
    an insulating film formed on said transfer channel, and
    a single transfer electrode having first and second segments in first and second layers formed on said insulating film for each of said photoelectric converting devices, said first and second segments being alternately disposed and electrically connected to a corresponding scanning line and thereby to each other for controlling vertical transfer of said charge packets in said transfer channel in response to a pulse signal commonly applied to said scan line,
    one of said first and second segments of each said transfer electrode being formed integrally with an electrode of a corresponding one of said plurality of transfer gates, respectively, so that all the electrodes of said transfer gates are formed in a single one of said first and second layers,
    said one of said first and second segments being insulated at one end thereof from another of said alternately disposed first and second segments forming a transfer electrode of an adjacent transfer device in the vertical transfer direction of said charge packet, said one segment being electrically connected at its other end to said scanning line and thereby to the other of said first and second segments thereby to form said single transfer electrode therewith, and
    separation regions including high concentration impurity layers of a first conductivity type for separating said photoelectric converting devices and said transfer devices.

2. A solid-state image sensor in accordance with claim 1, which comprises
  means for enhancing the potential in said transfer channel beneath said one of said first and second segments of said transfer electrodes common to said respective electrodes of said transfer gates.

3. A solid state image sensor in accordance with claim 2, wherein
  said means for enhancing the potential in said transfer channel comprises a high concentration impurity layer of said first conductivity type in said transfer channel beneath said one of said first and second segments of said transfer electrodes common to said respective electrodes of said transfer gates.

4. A solid state image sensor in accordance with claim 2, wherein
  said means for enhancing said potential in said transfer channel comprises said insulating film, the film thickness of said insulating film being selected to be thinner, in a portion beneath said one segment of said transfer electrodes common to said electrodes of said transfer gates, than the film thickness of a portion beneath said other of said first and second segments of said transfer electrodes not common to said electrodes of said transfer gates.

5. A solid state image sensor in accordance with claim 1, wherein said plurality of scanning lines are operable for supplying said transfer gate with a signal for selecting the photoelectric converting device where said charge packets are to be read.

6. A solid state CSD image sensor in accordance with claim 1, wherein said first and second layers of said transfer electrodes are formed of polysilicon.

7. In a solid-state CSD image sensor having a plurality of vertical charge transfer devices each operable for vertical transfer of charge packets received from a plurality of photoelectric converting devices, and a charge coupled device receiving said charge packets from said plurality of vertical charge transfer devices for horizontal charge transfer of charge packets received from said plurality of vertical charge transfer devices, including
  a semiconductor substrate of a first conductivity type,
  a plurality of photoelectric converting devices formed on said semiconductor substrate,
  a plurality of transfer gates formed on said semiconductor substrate corresponding to said respective photoelectric converting devices and including electrodes for selectively receiving charge packets from said corresponding photoelectric converting devices, and
  a plurality of scanning lines for selecting among rows of said photoelectric converting devices to provide said charge packets to said vertical charge transfer devices, the improvement comprising:
  a plurality of transfer devices formed on said semiconductor substrate for transferring vertically the signal charge received from said transfer gates, each said transfer device including
    a vertical transfer channel of a second conductivity type formed on said semiconductor substrate and serving as a vertical transfer path of said signal charges received from said transfer gates,
    an insulating film formed on said transfer channel, and
    a single transfer electrode having first and second segments in first and second layers formed on said insulating film for each of said photoelectric converting devices, said first and second segments being alternately disposed and electrically connected to a corresponding scanning line and thereby to each other for controlling vertical transfer of said signal charges in said transfer channel in response to a pulse signal commonly applied thereto,
    said one of said first and second segments of each of said transfer electrode being insulated at one end thereof from another of said alternately disposed first and second segments forming a transfer electrode of an adjacent transfer device in the vertical transfer direction of said signal charge, said one segment being electrically connected at its other end to said scanning line and thereby to the other of said first and second segments thereby to form said single transfer electrode therewith, and separation regions including high concentration impurity layers of a first conductivity type for separating said photoelectric converting devices and said transfer devices, and further including means for enhancing the potential in said transfer channel beneath said one of said first and second segments of said transfer electrodes, wherein said means for enhancing the potential in said transfer channel comprises a high concentration impurity layer of said first conductivity type in said transfer channel beneath said one of said first and second segments of said transfer electrodes and not common to said electrodes of said transfer gates.

8. In a solid state charge sweep device image sensor having a semiconductor substrate of a first conductivity type, a plurality of photoelectric converting devices formed on said semiconductor substrate, a plurality of transfer gates formed on said semiconductor substrate corresponding to said respective photoelectric converting devices and a plurality of transfer electrodes arranged so that each of said transfer gates is connected to only a single respective transfer electrode, said plurality of transfer electrodes operable for selectively receiving charge packets from said corresponding photoelectric converting devices, a plurality of vertical transfer devices formed on said semiconductor substrate for sweeping the signal charges received from said transfer gates of photoelectric converting devices of only one horizontal line to a vicinity of a horizontal transfer device during a single horizontal scan period of the image sensor and transferring the signal charges to the horizontal transfer device during a horizontal blanking period of the image sensor, a transfer channel of a second conductivity type provided for each vertical transfer device, each said transfer channel formed on said semiconductor substrate serving as a vertical transfer path of signal charges received from said transfer gates, and an insulating film formed on said transfer channel, the improvement wherein, in said transfer devices:

said transfer electrodes each includes first and second transfer electrode segments formed in first and second layers on said insulating film for controlling transfer of said signal charges in said transfer channel, said first transfer electrode segments alternating with said second transfer electrode segments, one set of said transfer electrode segments integrally formed with corresponding ones of said plurality of transfer gates in a single one of said layers thereby eliminating misregistration thereamong, said transfer gates thereby having common areas with said corresponding transfer electrode segments of said one set and, together therewith, defining in a direction of vertical charge transfer along said vertical transfer path a width of respective potential wells for said signal charges, said transfer electrode segments of said one set each being insulated at one end from an adjacent, alternating electrode segment of another set of segments in a direction of transfer of said signal charge and being electrically connected at an opposite end thereof to the adjacent, alternating, electrode segments of the other set, each pair of electrically connected electrode segments forming a single transfer electrode for transferring charge from a single transfer gate to a transfer channel of a vertical transfer device.

9. An improved solid state charge sweep device image sensor as recited in claim 8 wherein said transfer electrode segments of said other set are, at points of insulation from said transfer electrode segments of said one set, disposed adjacent to said common areas of said transfer gates and said transfer electrode segments of said one set, said transfer electrode segments of said other set thereby providing means for establishing a potential distribution in said transfer channel for overcoming deep potential wells established at said common areas and thereby transferring signal charges from said deep potential wells to said transfer channel.

10. An improved solid state charge sweep device image sensor as recited in claim 8 further comprising means for enhancing a potential distribution in said transfer channel beneath said common areas of said transfer gates and said transfer electrode segments of said one set, thereby overcoming deep potential wells formed in said transfer channel beneath said common areas and trapping signal charges therein, and thereby transferring signal charges from said deep potential wells to said transfer channel.

11. An improved solid state charge sweep device image sensor as recited in claim 10 wherein said means for enhancing a potential distribution comprises a high concentration impurity layer of said first conductivity type formed in said transfer channel beneath said common areas of said transfer electrode segments of said one set.

12. An improved solid state charge sweep device image sensor as recited in claim 10 wherein said means for enhancing a potential distribution comprises a high concentration impurity layer of said first conductivity type formed in said transfer channel beneath said transfer electrode segments of said one set.

13. An improved solid state charge sweep device image sensor as recited in claim 10 wherein said means for enhancing a potential distribution comprises an arrangement including a layer of said insulating film in a portion beneath said common areas being thinner than a layer of said insulating film beneath said transfer electrode segments of said other set.

14. An improved solid state charge sweep device image sensor as recited in claim 8, wherein said electrode segments of the other set adjacent said opposite end of said segments of said one set are immediately adjacent respective ones of said potential wells defined by said segments of said one set to provide independently controllable potential distribution immediately adjacent said potential wells, thereby to sweep completely the signal charge from said potential wells, whereby trapped charge phenomena associated with said potential wells are eliminated.

15. An improved solid state charge sweep device image sensor as recited in claim 14, further comprising a plurality of scanning lines for selecting respective rows of transfer gates to read said charge packets of said photoelectric converting devices, wherein one electrode segment of said one set, defining a width of one of said potential wells, is connected to one of said scanning lines and one electrode segment of said other set, immediately adjacent said potential well, is connected to a different one of said scanning line for establishing said potential distribution adjacent said potential well to sweep completely the signal charge from said potential well.

16. In a solid-state charge sweep device image sensor having a plurality of vertical charge transfer devices each operable for vertical transfer of charge packets received from a plurality of photoelectric converting devices, and a charge coupled device receiving said charge packets from said plurality of vertical charge transfer devices for horizontal charge transfer of charge packets received from said plurality of vertical charge transfer devices, including
  a semiconductor substrate of a first conductivity type,
  a plurality of photoelectric converting devices formed on said semiconductor substrate,
  a plurality of transfer gates formed on said semiconductor substrate corresponding to said respective photoelectric converting devices and including electrodes for selectively receiving charge packets from said corresponding photoelectric converting devices and for transferring said charge packets to a vertical transfer channel of a corresponding vertical charge transfer device, said electrodes of said transfer gates forming potential wells in said vertical charge transfer device, and
  a plurality of scanning lines for selecting among rows of said photoelectric converting devices to provide said charge packets to said vertical charge transfer devices, the improvement comprising:
  an arrangement of transfer electrodes for reducing trapping of charges in the potential wells formed in said vertical charge transfer devices, including, for each photoelectric converting device,
  a single transfer electrode having first and second segments in first and second layers formed on an insulating film on said substrate, said first and second segments being alternately disposed and electrically connected to a corresponding scanning line and thereby to each other to form said single transfer electrode for controlling vertical transfer of said charge packets in said vertical transfer channel in response to a pulse signal applied thereto,
  one of said first and second segments of each said transfer electrode being formed integrally with an electrode of a corresponding one of said plurality of transfer gates, respectively, and forming said potential well therewith, whereby all the electrodes of said transfer gates are formed in a single one of said first and second layers to eliminate misregistration between said transfer gates and said transfer electrodes thereby reducing fixed pattern noise in the image sensor,
  said one of said first and second segments being insulated at one end thereof from another of said alternately disposed first and second segments forming a separate, adjacent, transfer electrode of a photoelectric converting device adjacent in the vertical transfer direction of said charge sweep device image sensor, said one segment being electrically connected at its other end to said scanning line,
  thereby providing an adjacent, independently controllable electrode immediately adjacent said potential well for completely sweeping a charge packet from said potential well to eliminate trapped charge.

17. An improved charge-sweep device image sensor as recited in claim 16, wherein said other segment of each transfer electrode is formed in said first layer and has a substantially horizontal portion, and
  said one segment of each transfer electrode is formed in said second layer and includes a first horizontal portion and a pair of second horizontal portions vertically removed from said first horizontal portion and connected thereto,
  said second horizontal portions of said one segment comprising said one and other ends thereof, respectively.

18. An improved charge-sweep device image sensor as recited in claim 17, wherein said first and other ends of said one segment overlie ends of a pair of other segments formed in said first layer,
  said first end of said one segment overlying and insulated from an end of one of said pair of other segments,
  said other end of said one segment connected to said scanning line and thereby to an end of the other of said pair of other segments to form therewith said single transfer electrode.

19. An improved charge-sweep device image sensor as recited in claim 18, wherein said first horizontal portion of said one segment defines said potential well and said end of said one of said other segments underlying said one end of said one segment forms said adjacent, independently controllable electrode immediately adjacent said potential well,
  said adjacent independently controllable electrode being connected to a separate scanning line for varying a potential distribution in a vicinity immediately adjacent said potential well thereby enabling completely sweeping said charge packet from said potential well to eliminate trapped charge therefrom.

20. In a charge-sweep device image sensor having
  a semiconductor substrate of a first conductivity type,
  a plurality of photoelectric converting devices formed on said semiconductor substrate,
  a plurality of transfer gates formed on said semiconductor substrate corresponding to said respective photoelectric converting devices and including electrodes for selectively receiving charge packets from said corresponding photoelectric converting devices and for transferring said charge packets to a vertical transfer channel of a corresponding charge device, said electrodes of said transfer gates forming potential wells in said transfer device, the improvement comprising:
  transfer electrodes being formed in two layers for reducing fixed pattern noise,
  each transfer electrode having first and second segments formed in first and second layers formed on an insulating film on said substrate, said first and second segments formed in alternating locations to be alternately disposed, said first and second segments formed in electrical contact with a corresponding scanning line and thereby with each other to form a single transfer electrode for controlling vertical transfer of said signal charge packets in said vertical transfer channel in response to a pulse signal applied thereto,
  one of said first and second segments of each said transfer electrode being formed integrally with an electrode of a corresponding one of said plurality of transfer gates, respectively, and forming said potential well therewith, whereby all the electrodes of said transfer gates are formed in a single layer.

21. In an image sensor including transfer devices produced by formation of a plurality of layers on a semiconductor substrate as recited in claim 20,
wherein said one of said first and second segments of said transfer electrode is formed to be insulated at one end thereof from another of said alternately disposed first and second segments formed in a separate transfer electrode of a photoelectric converting device adjacent in the vertical transfer direction of said transfer device, said one of said first and second segments being formed in electrical contact at its other end to said scanning line and thus to the other segment formed in said second layer, thereby providing an adjacent, independently controllable electrode immediately adjacent said potential well for completely sweeping said signal charge packet from said potential well to eliminate trapped charge.

* * * * *